United States Patent
Nakazawa et al.

(10) Patent No.: US 9,041,907 B2
(45) Date of Patent: May 26, 2015

(54) DRAWING DEVICE AND DRAWING METHOD

(75) Inventors: Yoshiyuki Nakazawa, Kyoto (JP); Yoshio Furuya, Kyoto (JP); Ryosuke Ito, Kyoto (JP); Kenji Nakanishi, Kyoto (JP); Kazutaka Taniguchi, Kyoto (JP); Ryo Yamada, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 999 days.

(21) Appl. No.: 13/086,762

(22) Filed: Apr. 14, 2011

(65) Prior Publication Data
US 2012/0081681 A1 Apr. 5, 2012

(30) Foreign Application Priority Data

Sep. 30, 2010 (JP) ................................. 2010-220796
Mar. 4, 2011 (JP) ................................. 2011-047372

(51) Int. Cl.
G03B 27/68 (2006.01)
G03B 27/32 (2006.01)
G03B 27/50 (2006.01)
G03B 27/52 (2006.01)
G03F 7/20 (2006.01)

(52) U.S. Cl.
CPC ............... *G03B 27/32* (2013.01); *G03B 27/50* (2013.01); *G03B 27/52* (2013.01); *G03F 7/70291* (2013.01); *G03F 7/70308* (2013.01); *G03F 7/70508* (2013.01)

(58) Field of Classification Search
CPC ........... G03F 7/70291; G03F 7/70308; G03F 7/70508

USPC .................... 355/53, 30, 52, 55, 71; 430/325; 359/291

See application file for complete search history.

(56) References Cited

U.S. PATENT DOCUMENTS

| | | | |
|---|---|---|---|
| 5,867,319 | A | 2/1999 | Sugiyama et al. |
| 6,859,223 | B2 | 2/2005 | Shirota et al. |
| 7,385,675 | B2 | 6/2008 | George et al. |
| 7,576,834 | B2 | 8/2009 | George et al. |

(Continued)

FOREIGN PATENT DOCUMENTS

| | | |
|---|---|---|
| JP | 2797506 | 7/1998 |
| JP | 2001-176769 | 6/2001 |

(Continued)

OTHER PUBLICATIONS

Korean Decision to Grant dated Feb. 1, 2013 received from the Korean Patent Office in connection with corresponding Korean application No. 10-2011-0036816.

(Continued)

*Primary Examiner* — Deoram Persaud
(74) *Attorney, Agent, or Firm* — Ostrolenk Faber LLP

(57) ABSTRACT

A drawing device draws a pattern on a substrate by radiating light from an optical head part on a target object (for example, substrate) which relatively moves with respect to the optical head part. Here, the optical head part has a spatial modulating unit which spatially modulates light from a light source, based on pattern data, and an optical path corrector which shifts the route of light spatially modulated in the spatial modulating unit at precision subdivided more than units of spatial modulation in the spatial modulating unit (more specifically, for example, units of pixels of spatial light modulator).

7 Claims, 13 Drawing Sheets

(56) References Cited

U.S. PATENT DOCUMENTS

| | | | |
|---|---|---|---|
| 7,982,853 B2 | 7/2011 | Skibicki et al. | |
| 8,390,790 B2 | 3/2013 | Mangold et al. | |
| 8,395,752 B2* | 3/2013 | Laidig | 355/53 |
| 8,395,755 B2 | 3/2013 | George et al. | |
| 8,675,175 B2 | 3/2014 | George et al. | |
| 8,842,359 B1* | 9/2014 | Payne et al. | 359/291 |
| 2003/0222966 A1 | 12/2003 | Shirota et al. | |
| 2005/0007572 A1 | 1/2005 | George et al. | |
| 2005/0041229 A1* | 2/2005 | Meisburger | 355/53 |
| 2005/0046819 A1* | 3/2005 | Bleeker et al. | 355/67 |
| 2006/0024591 A1 | 2/2006 | Itoh | |
| 2006/0066830 A1* | 3/2006 | Yamazoe | 355/67 |
| 2006/0072091 A1* | 4/2006 | Kato | 355/53 |
| 2007/0296936 A1* | 12/2007 | Kato et al. | 355/52 |
| 2008/0218718 A1 | 9/2008 | George et al. | |
| 2008/0266536 A1 | 10/2008 | Skibicki et al. | |
| 2009/0148172 A1 | 6/2009 | Fukui et al. | |
| 2009/0227112 A1 | 9/2009 | Itoh | |
| 2009/0284720 A1 | 11/2009 | George et al. | |
| 2010/0091256 A1 | 4/2010 | Mangold et al. | |
| 2010/0208329 A1* | 8/2010 | Sandstrom et al. | 359/291 |
| 2010/0228379 A1 | 9/2010 | Itoh | |
| 2011/0181856 A1* | 7/2011 | Lee et al. | 355/56 |
| 2013/0201466 A1 | 8/2013 | George et al. | |

FOREIGN PATENT DOCUMENTS

| | | |
|---|---|---|
| JP | 2004-056080 | 2/2004 |
| JP | 2004-056080 | 2/2004 |
| JP | 2004-363590 | 12/2004 |
| JP | 2006-085072 | 3/2006 |
| JP | 2006-085072 | 3/2006 |
| JP | 10-2006-0046772 | 5/2006 |
| JP | 2006-178057 | 7/2006 |
| JP | 2006-350034 | 12/2006 |
| JP | 2007-003934 | 1/2007 |
| JP | 2007-052080 | 3/2007 |
| JP | 2007-052080 | 3/2007 |
| JP | 2008-541419 | 11/2008 |
| JP | 2008-541419 | 11/2008 |
| JP | 2009-244446 | 10/2009 |
| JP | 4419233 | 12/2009 |
| JP | 2010-524211 | 7/2010 |
| JP | 2010-191127 | 9/2010 |
| KR | 1998-032037 | 7/1998 |
| KR | 10-2010-0094353 | 8/2010 |
| WO | WO 2006-134956 | 12/2006 |

OTHER PUBLICATIONS

Korean Office Action received from the Korean Patent Office dated Aug. 23, 2012 for corresponding Korean application No. 10-2011-0036816.
Japanese translation of Korean Office Action and English translation of Japanese translation of Korean Office Action.
Office Action issued by Japanese Patent Office on Sep. 16, 2014 in connection with corresponding Japanese Patent Application No. 2011-047372 with English Translation thereof.
Decision to Grant issued by Japanese Patent Office on Feb. 17, 2015 in connection with.
corresponding Japanese Patent Application No. 2011-047372.

* cited by examiner

F I G . 4
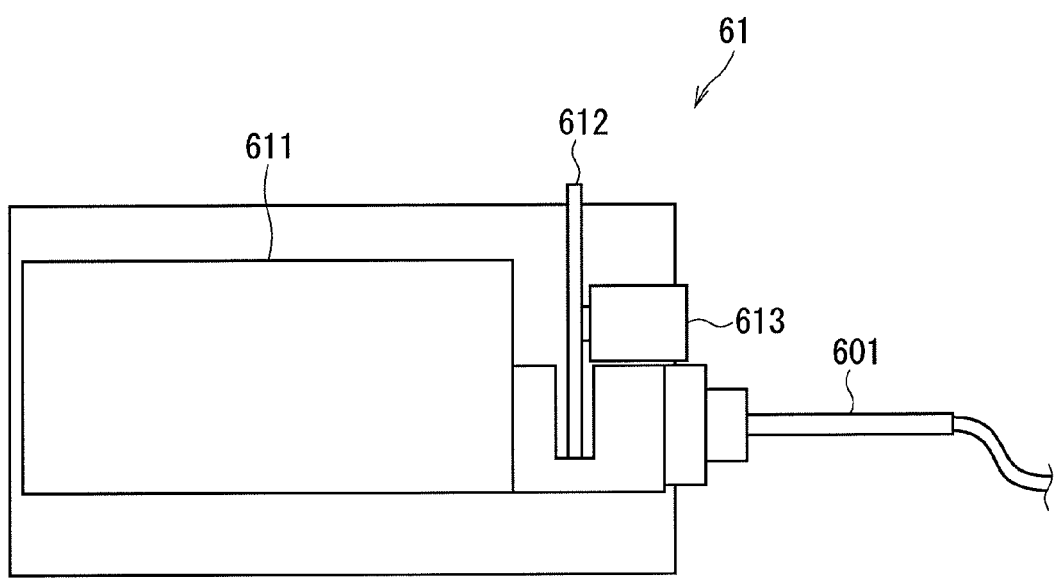

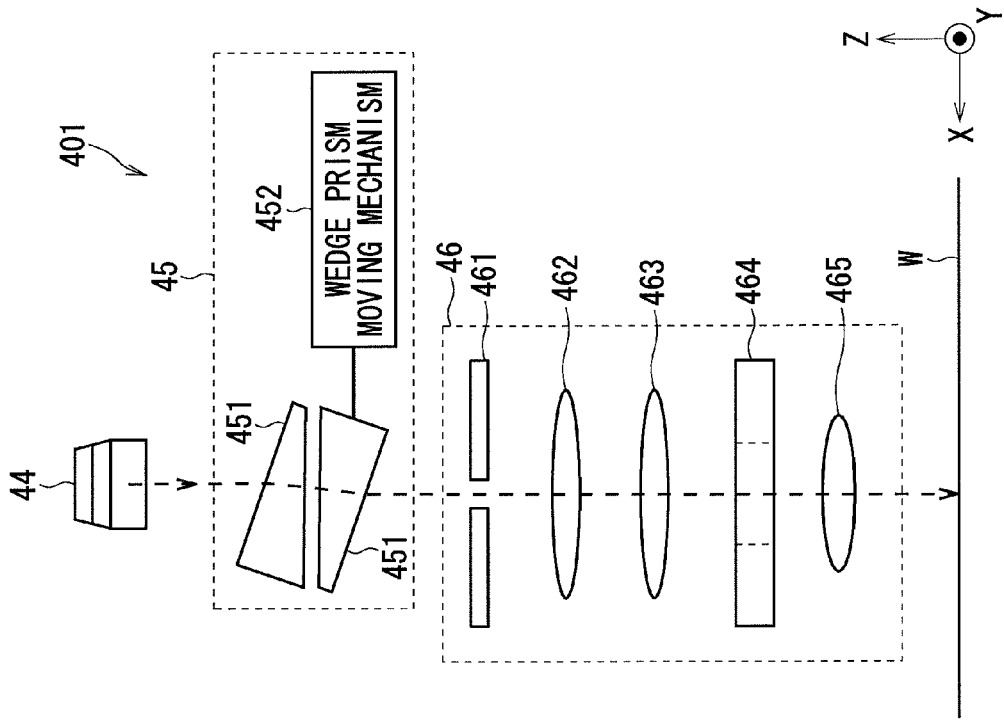
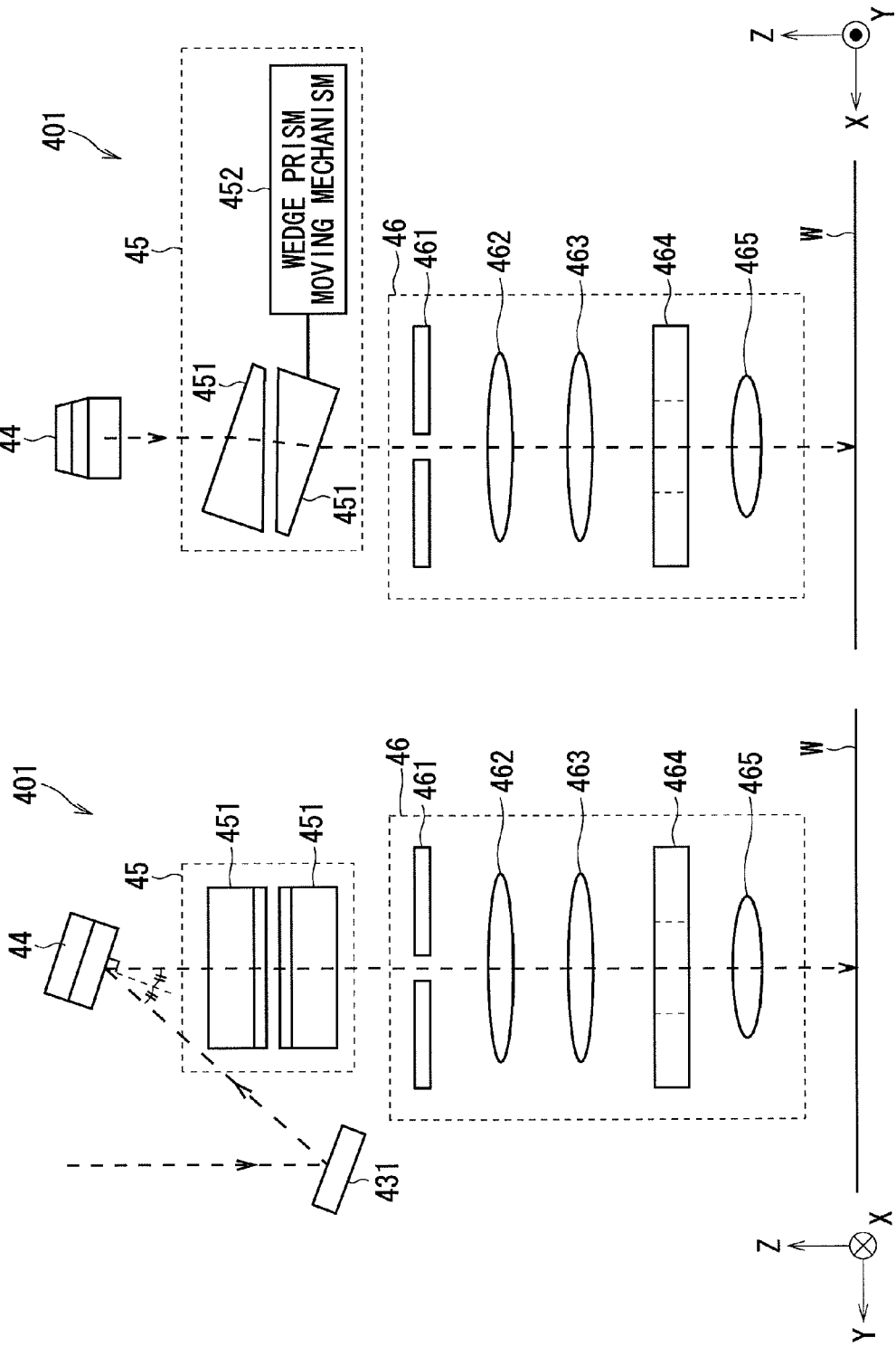

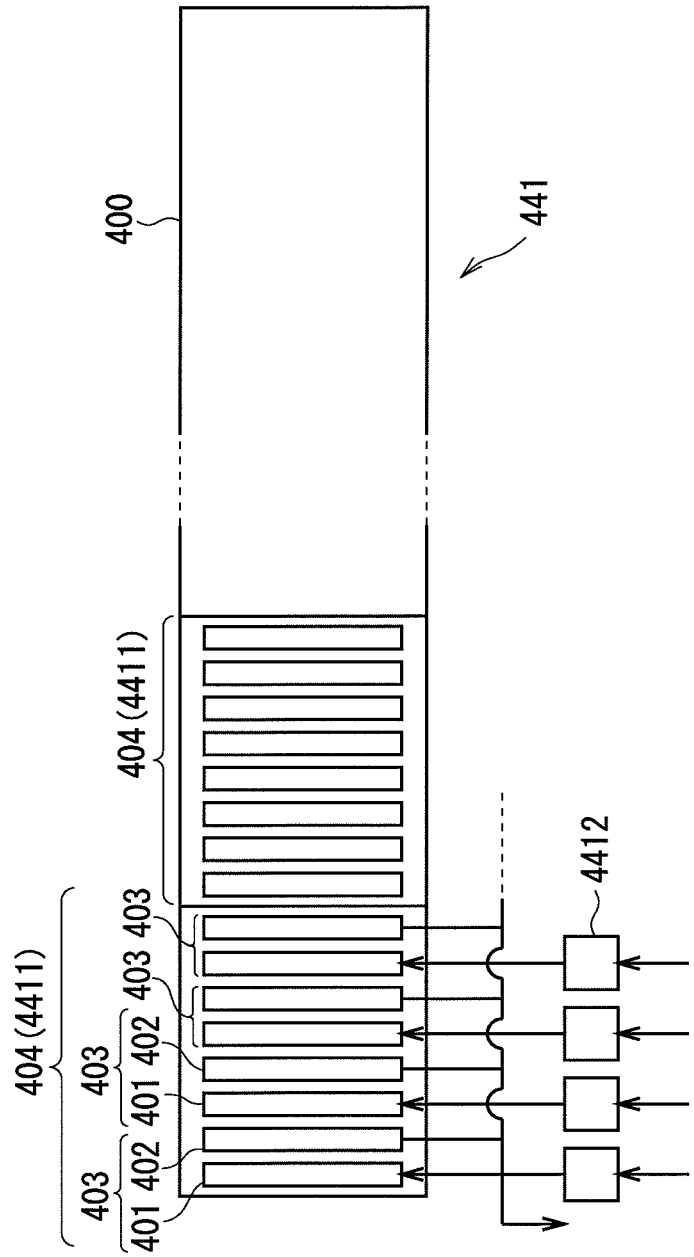

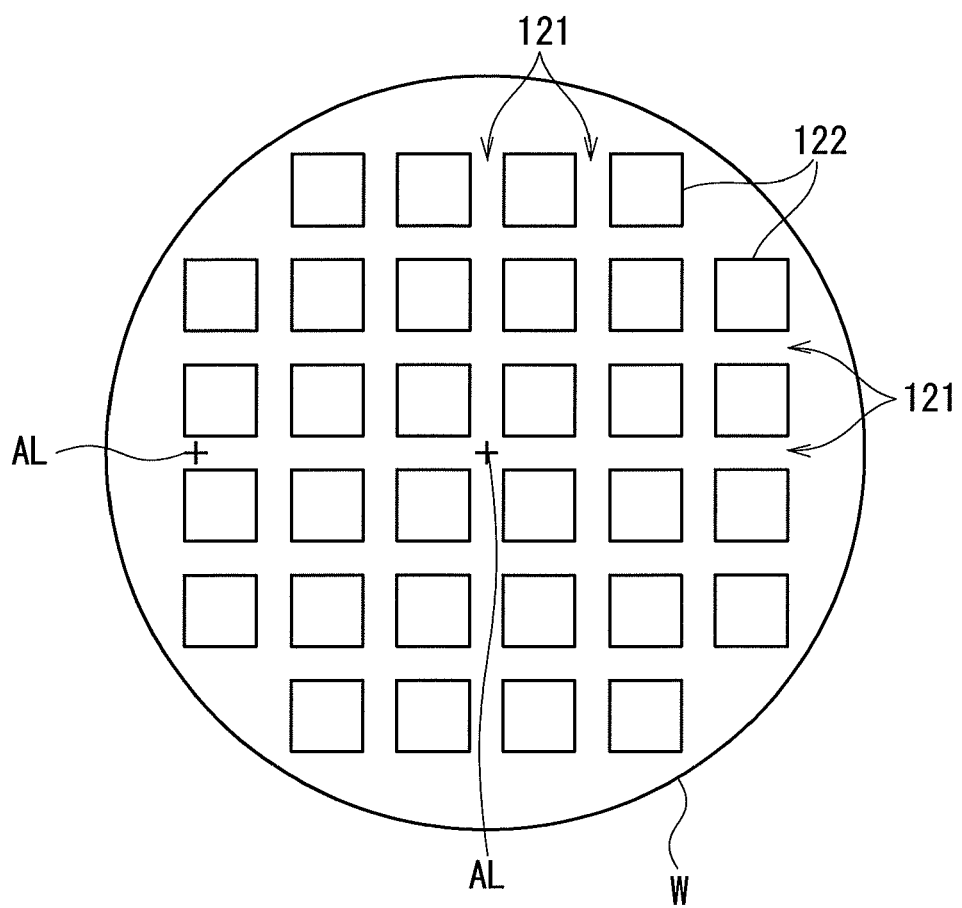
F I G. 1 0

F I G. 1 1
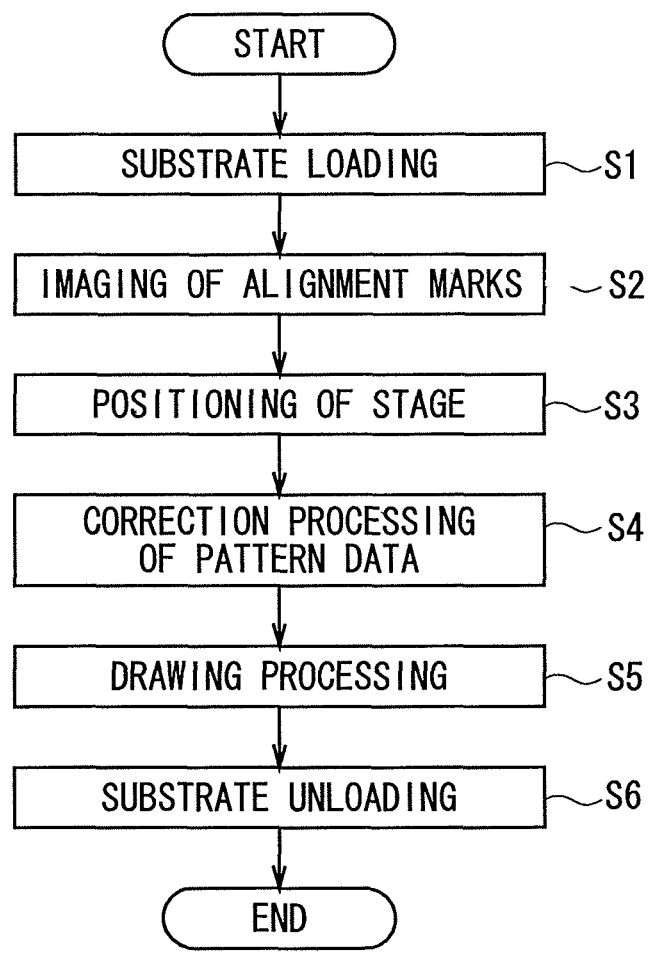

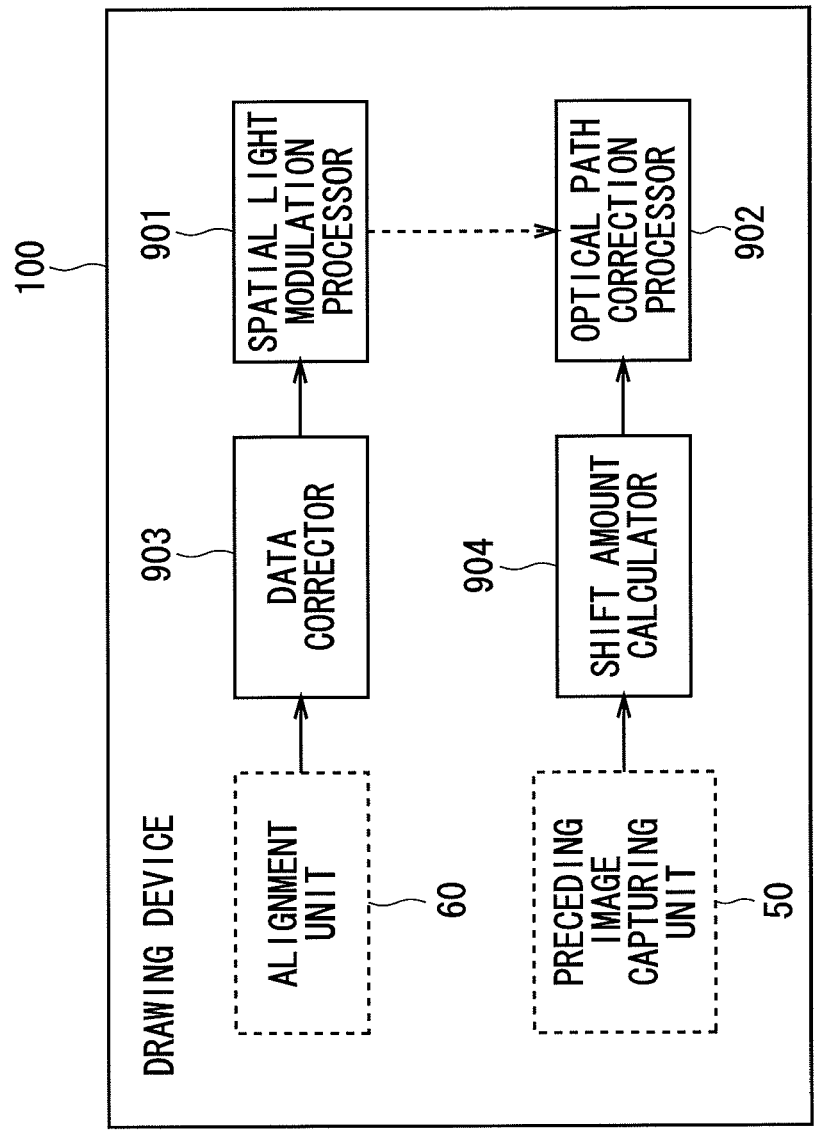
F I G . 1 4

DRAWING DEVICE AND DRAWING METHOD

BACKGROUND OF THE INVENTION

1. Field of the Invention

The present invention relates to a technique of drawing a pattern on a target object by radiating light from an optical head on the target object which relatively moves with respect to the optical head.

2. Description of the Background Art

In the following description, the "substrate" refers to, for example, a semiconductor substrate, printed substrate, a color filter substrate equipped in a liquid crystal display device, or a flat panel display (FPD) glass substrate of a liquid crystal display device, a plasma display device, or the like.

Although various exposure devices are conventionally proposed which performs various exposure processes with respect to substrates by radiating light on a substrate coated with a photosensitive material and drawing a pattern (exposure pattern) on the substrate, in recent years in particular, an exposure device (so-called direct drawing device) of a type which directly draws a pattern on a substrate from, for example, CAD data without using a photomask is getting an attention. The direct drawing device is disclosed in, for example, Japanese Patent Application Laid-Open No. 2006-350034, Japanese Patent Application Laid-Open No. 3-89511 (1991), Japanese Patent Application Laid-Open No. 2001-176769, and Japanese Patent Application Laid-Open No. 2009-244446.

For example, the direct drawing device disclosed in Japanese Patent Application Laid-Open No. 2006-350034 spatially modulates light from a light source by controlling a DMD (Digital Micro-mirror Device) (registered trademark) which is a spatial modulator based on CAD data in which a pattern is described. Then, a pattern is drawn on the substrate by forming an image of spatially modulated light on the substrate.

Incidentally, the direct drawing device is demanded to precisely control a drawing position. When, for example, multiple exposure is performed, the next pattern must be drawn such that the next pattern is precisely overlaid on an existing pattern (underlying pattern) previously formed on the substrate.

However, although a thermal processing is applied thereafter to the substrate on which the underlying pattern is formed, after this thermal processing is performed, the substrate changes its shape due to distortion, shrinkage or expansion and therefore the underlying pattern formed on the substrate also changes due to the change of the shape. Further, when a different drawing device (exposure equipment) forms an underlying pattern, the underlying pattern also changes due to an instrumental error or precision. It is not easy to precisely overlay and draw the next pattern on the changed underlying pattern.

For example, Japanese Patent Application Laid-Open No. 2006-350034 discloses a technique of forming the next pattern at high overlaying precision in response to the change of an underlying pattern. This patent document discloses a configuration of detecting a position of an underlying pattern through a monitor before drawing a pattern, specifying the amount of position offset of the underlying pattern and correcting CAD data of the pattern which must be additionally formed according to the specified amount of position offset. According to this configuration, it is possible to draw a pattern such that the pattern is overlaid on the underlying pattern having a position offset by spatially modulating light from a light source using the corrected CAD data and forming an image of spatially modulated light on a substrate.

As described above, by applying the conventional technique of correcting CAD data of the pattern according to the amount of change of the underlying pattern, it is possible to draw a pattern such that the pattern is overlaid on the changed underlying pattern. Meanwhile, in this case, no matter how accurately CAD data is corrected, an actual drawing position is only corrected in pixel units of a spatial modulator. That is, it is fundamentally impossible to control a drawing position at precision subdivided more than a pixel size of the spatial modulator.

SUMMARY OF THE INVENTION

The present invention is directed to a drawing device which draws a pattern on a target object by radiating light from an optical head on the target object which relatively moves with respect to the optical head. In the drawing device according to an aspect of the present invention, the optical head includes a spatial light modulating part which spatially modulates light from a light source based on pattern data in which a pattern to be drawn on the target object is described, and an optical path corrector which corrects a drawing position by shifting a path of light spatially modulated in the spatial light modulating part at a precision subdivided more than units of the spatial modulation in the spatial light modulating part.

According to the present invention, the optical path corrector corrects the drawing position by shifting the path of light spatially modulated in the spatial light modulating part at precision subdivided more than units of spatial modulation in the spatial light modulating part, so that it is possible to precisely control the drawing position of the pattern with respect to the target object.

Preferably, the drawing device according to another aspect of the present invention further includes a data corrector which corrects the pattern data based on a position of an existing pattern previously formed on the target object, wherein the spatial light modulating part spatially modulates light from the light source based on the corrected pattern data.

According to the present invention, the spatial light modulating part spatially modulates light based on the pattern data corrected based on the position of the existing pattern previously formed, and the optical path corrector corrects the path of spatially modulated light at precision subdivided in units of spatial modulation. According to this configuration, it is possible to precisely control the drawing position with respect to the existing pattern. For example, it is possible to draw a pattern which is precisely overlaid on the existing pattern.

Preferably, the drawing device according to still another aspect of the present invention further includes a shift amount calculator which detects a position of an existing pattern previously formed on the target object, from captured image data obtained by capturing an image of a drawing scheduled area of the target object, and calculates an amount of shift for shifting the path of spatially modulated based on the detected position.

According to the present invention, by detecting the position of the existing pattern from the captured image data obtained by capturing an image of the drawing scheduled area and calculating the amount of shift for shifting the path of spatially modulated light based on this detection position, it is possible to accurately control the drawing position with respect to the existing pattern.

Preferably, the drawing device according to yet another aspect of the present invention further includes an image capturer which is provided on a front side of the optical head in a direction in which the optical head relatively moves with respect to the target object and which captures the image of the drawing scheduled area.

According to the present invention, the image capturer which captures the image of the drawing scheduled area of the target object is provided in the front side of the optical head (front side in the direction in which the optical head relatively moves with respect to the target object), so that it is possible to reliably and efficiently measure the position of the existing pattern previously formed in the area in the target object on which the optical head draws a pattern.

Preferably, in the drawing device according to yet another aspect of the present invention, the spatial light modulating part includes a plurality of light modulators which are aligned in a certain direction, and spatially modulates light from the light source in units of pixels of each of the plurality of light modulators.

Preferably, in the drawing device according to yet another aspect of the present invention, the light modulator is a light modulator of a diffraction grating type.

Preferably, in the drawing device according to yet another aspect of the present invention, the data corrector predicts the position of the existing pattern previously formed on the target object based on captured image data obtained by capturing an image of a representative position of the target object, and corrects the pattern data based on the predicted position of the existing pattern previously formed on the target object.

Preferably, in the drawing device according to yet another aspect of the present invention, the optical path corrector includes an optical system in which two prisms including optical surfaces which are not parallel, are arranged on the path of spatially modulated light, and a prism mover which changes a separated distance between the two prisms to shift the path of spatially modulated light.

Further, the present invention is directed to the drawing method of radiating light on the target object and drawing the pattern on the target object.

According to the present invention, the route of spatially modulated light is shifted at precision subdivided more than units of spatial modulation, so that it is possible to precisely control the pattern drawing position on the target object.

In view of above, it is an object of the present invention to provide a technique of precisely controlling a pattern drawing position on a target object.

These and other objects, features, aspects and advantages of the present invention will become more apparent from the following detailed description of the present invention when taken in conjunction with the accompanying drawings.

BRIEF DESCRIPTION OF THE DRAWING

FIG. 4 is a view illustrating a configuration example of an illuminating unit;

FIG. 5A is a view schematically illustrating a configuration example of a drawing unit;

FIG. 5B is a view schematically illustrating a configuration example of a drawing unit;

FIG. 6 is a view schematically illustrating a configuration example of a spatial light modulating member;

FIG. 7 is a view illustrating the spatial light modulator in a state where a voltage is turned on;

FIG. 10 is a view schematically illustrating a substrate to be processed;

FIG. 11 is a flow chart illustrating a flow of a series of processings to be executed by the drawing device;

FIG. 14 is a block diagram illustrating each function realized in the drawing device.

DESCRIPTION OF THE PREFERRED EMBODIMENTS

Hereinafter, preferred embodiments of the present invention will be described with reference to the drawings. In addition, each drawing referred to in the following description is assigned a common XYZ orthogonal coordinate system to clarify the positional relationship and operation direction of each member.

<1. Configuration of Drawing Device 100>
<1-1. Entire Configuration>

Figure 1:
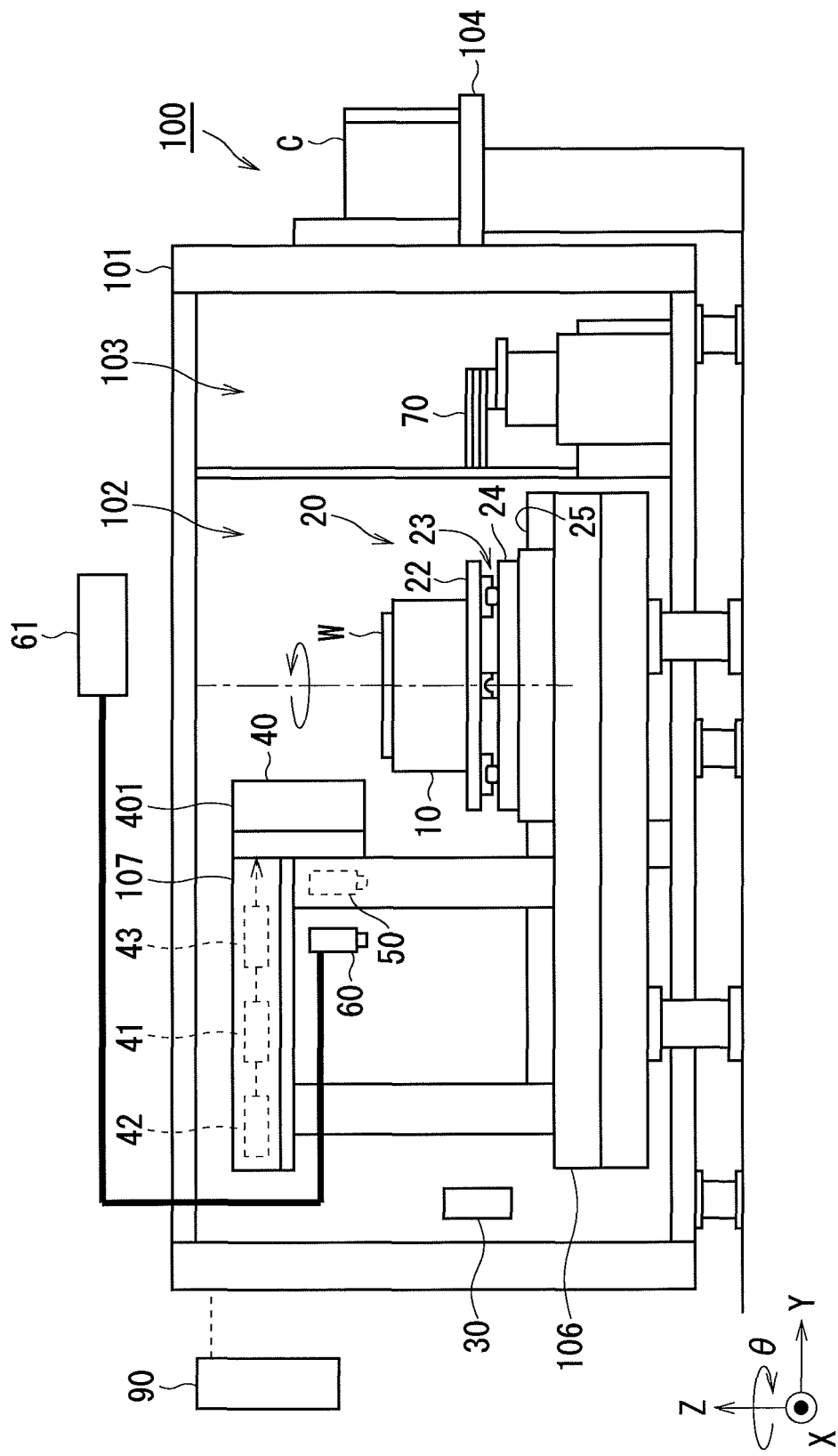
FIG. 1 is a side view of a drawing device.
Figure 2:
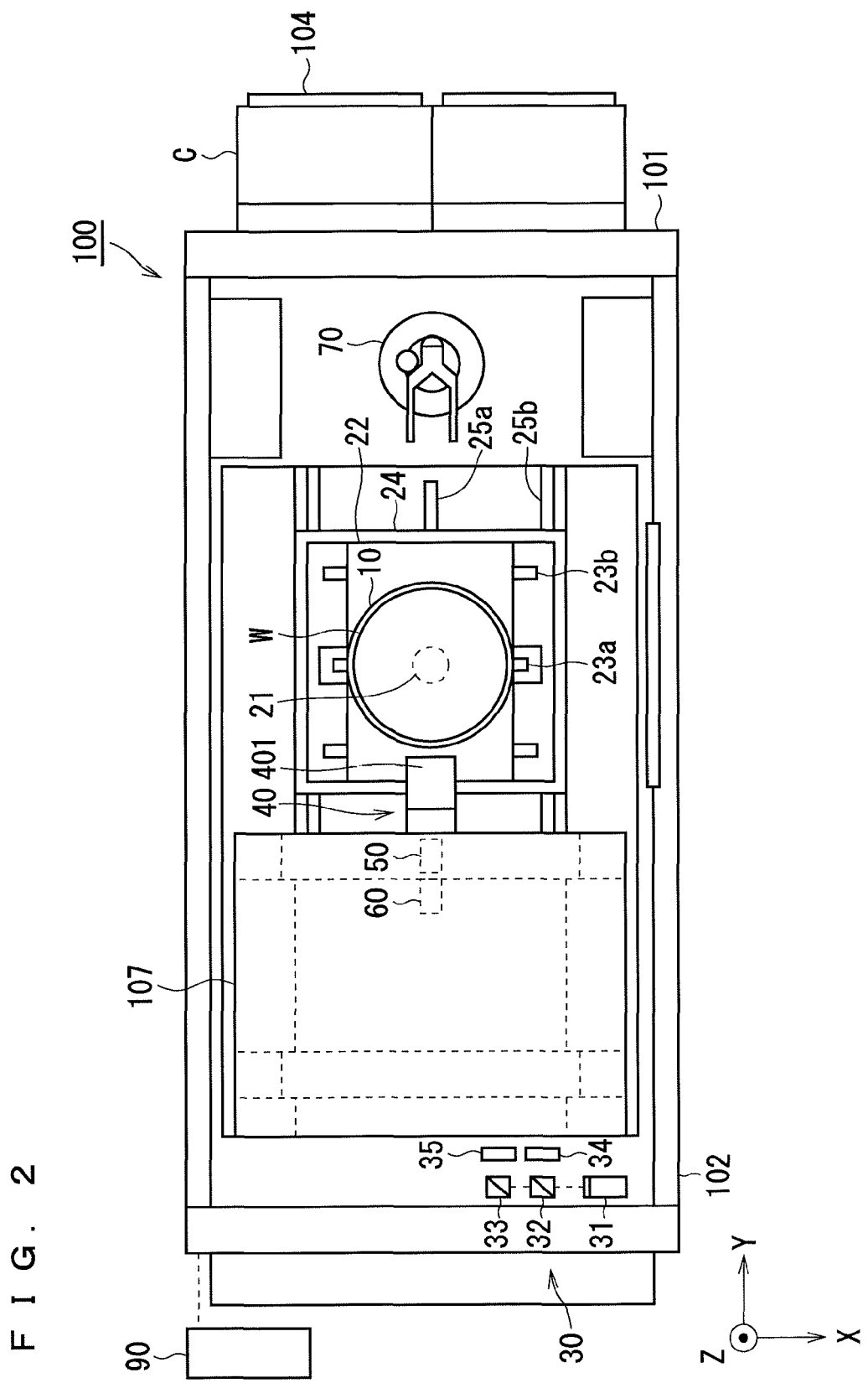
FIG. 2 is an upper surface view of the drawing device.

FIG. 1 and FIG. 2 are a side view and an upper surface view illustrating a configuration of a drawing device 100 according to one preferred embodiment of the present invention. The drawing device 100 is a device (so-called "direct drawing device") which draws a predetermined pattern by radiating light on an upper surface of a semiconductor substrate (hereinafter, referred to simply as "substrate") W on which a layer of a photosensitive material such as a resist is formed.

The drawing device 100 employs a configuration arranging various components of the drawing device 100 in the interior of a main body which is formed by attaching a cover to a main body frame 101 and in the exterior of the main body which is provided outside of the main body frame 101.

In the interior of the main body of the drawing device 100, a processing area 102 and a delivery area 103 are formed. In the processing area 102, a stage 10 which holds the substrate W, a stage moving mechanism 20 which moves the stage 10, a stage position measurer 30 which measures the position of the stage 10, an optical head part 40 which radiates light on the upper surface of the substrate W, a preceding image capturing unit 50 which captures an image of a drawing scheduled area on the substrate W and an alignment unit 60 which captures images of alignment marks on the substrate W are arranged. By contrast with this, in the delivery area 103, a transporting device 70 which carries the substrate W in and out of the processing area 102 is arranged.

Further, in the exterior of the main body of the drawing device 100, an illuminating unit 61 which supplies illumination light to the alignment unit 60 is arranged. Further, in the exterior of the main body, a controller 90 which is electrically connected with each part provided in the drawing device 100 and which controls an operation of each part is arranged.

In addition, in the exterior of the main body of the drawing device 100 and in the position adjacent to the delivery area 103, a cassette setter 104 on which a cassette C is set is arranged. The transporting device 70 arranged in the delivery area 103 takes out an unprocessed substrate W accommodated in the cassette C set on the cassette setter 104 and carries the substrate W in the processing area 102, and carries the processed substrate W out from the processing area 102 to accommodate in the cassette C. The cassette C is delivered to the cassette setter 104 by an external transporting device which is not illustrated.

<1-2. Configuration of Each Part>

<Stage 10>

The stage 10 is a holder which has an outer shape of a flat plate shape, and which holds the substrate W by setting the substrate W with a horizontal posture, on the upper surface of the stage 10. A plurality of suction holes (not illustrated) are formed in the upper surface of the stage 10, and negative pressures (suction pressures) are produced in these suction holes to fix and hold the substrate W which is set on the stage 10, on the upper surface of the stage 10.

<Stage Moving Mechanism 20>

The stage moving mechanism 20 is a mechanism which moves the stage 10 in a main scan direction (Y axis direction), a sub scan direction (X axis direction) and a rotation direction (rotation direction about the Z axis (0 axis direction)). The stage moving mechanism 20 has a rotating mechanism 21 which rotates the stage 10; a support plate 22 which rotatably supports the stage 10; a sub scan mechanism 23 which moves the support plate 22 in the sub scan direction; a base plate 24 which supports the support plate 22 through the sub scan mechanism 23; and a main scan mechanism 25 which moves the base plate 24 in the main scan direction. The rotating mechanism 21, sub scan mechanism 23 and main scan mechanism 25 are electrically connected with the controller 90, and moves the stage 10 according to the command from the controller 90.

Above the support plate 22, the rotating mechanism 21 rotates the stage 10 about the vertical rotation axis on the upper surface of the substrate W.

The sub scan mechanism 23 has a linear motor 23a which is formed with a mover attached in the lower surface of the support plate 22 and a stator laid on the upper surface of the base plate 24. Further, a pair of guiders 23b extending in the sub scan direction are provided between the support plate 22 and base plate 24. Hence, when the linear motor 23a is activated, the support plate 22 moves in the sub scan direction along the guider 23b on the base plate 24.

The main scan mechanism 25 has a linear motor 25a which is formed with a mover attached in the lower surface of the base plate 24 and a stator laid on a base 106 of the drawing device 100. Further, a pair of guiders 25b extending in the main scan direction are provided between the base plate 24 and base 106. Hence, when the linear motor 25a is activated, the base plate 24 moves in the main scan direction along the guider 25b on the base 106.

<Stage Position Measurer 30>

The stage position measurer 30 is a mechanism which measures the position of the stage 10. The stage position measurer 30 is electrically connected with the controller 90, and measures the position of the stage 10 according to the command from the controller 90.

The stage position measurer 30 can be formed with, for example, a mechanism which measures the position of the stage 10 by radiating laser light toward the stage 10 and utilizing interference between reflected light of the laser light and emitted light. In this case, the stage position measurer 30 has, for example, an emitter 31 which emits laser light, a beam splitter 32, a beam bender 33, a first interferometer 34 and a second interferometer 35. The emitter 31 and each of the interferometers 34 and 35 are electrically connected with the controller 90, and measure the position of the stage 10 according to the command from the controller 90.

The laser light emitted from the emitter 31 is first incident on the beam splitter 32, and is branched into first branched light going toward the beam bender 33 and second branched light going toward the second interferometer 35. The first branched light is reflected by the beam bender 33, is incident on the first interferometer 34 and is radiated on the first portion of the stage 10 from the first interferometer 34. Then, the first branched light reflected by the first portion is incident on the first interferometer 34 again. The first interferometer 34 measures a position parameter corresponding to the first position based on the interference between the first branched light going toward the first portion of the stage 10 and the first branched light reflected by the first portion.

By contrast with this, the second branched light is incident on the second interferometer 35, and is radiated on a second portion (which is a position different from the first portion) of the stage 10 from the second interferometer 35. Then, the second branched light reflected by the second portion is incident on the second interferometer 35 again. The second interferometer 35 measures a position parameter corresponding to the position of the second portion based on the interference between the second branched light going toward the second portion of the stage 10 and the second branched light reflected by the second portion of the stage 10.

The controller 90 acquires the position parameter corresponding to the position of the first portion of the stage 10 and the position parameter corresponding to the second portion of the stage 10, from the first interferometer 34 and second interferometer 35, respectively. Then, the controller 90 calculates the position of the stage 10 based on each of the acquired position parameters.

<Optical Head Part>

The optical head part 40 is a mechanism which radiates light on the upper surface of the substrate W held on the stage 10. The optical head part 40 is provided to a frame 107 which is bridged over the base 106 stepping over the stage 10 and stage moving mechanism 20.

The optical head part 40 has a laser oscillator 41 which emits laser light, a laser driver 42 which drives the laser oscillator 41, and an illumination optical system 43 which converts light (spot beam) emitted from the laser oscillator 41, into linear light of uniform intensity distribution (light having a linear light flux cross-sectional surface) (line beam). Each of these parts 41, 42 and 43 is arranged inside a box which forms a ceiling of the frame 107. Further, each of these parts 41, 42 and 43 is electrically connected with the controller 90, and operates according to the command from the controller 90.

The optical head part 40 further has a drawing unit 401 which is accommodated inside an annexed box attached to the +Y side of the frame 107. The drawing unit 401 spatially modulates light which is emitted from the laser oscillator 41 and is incident on the drawing unit 401 through the illumination optical system 43, according to pattern data, and radiates the light on the upper surface of the substrate W. The configuration of the drawing unit 401 will be described in detail below.

<Preceding Image Capturing Unit 50>

Figure 3:
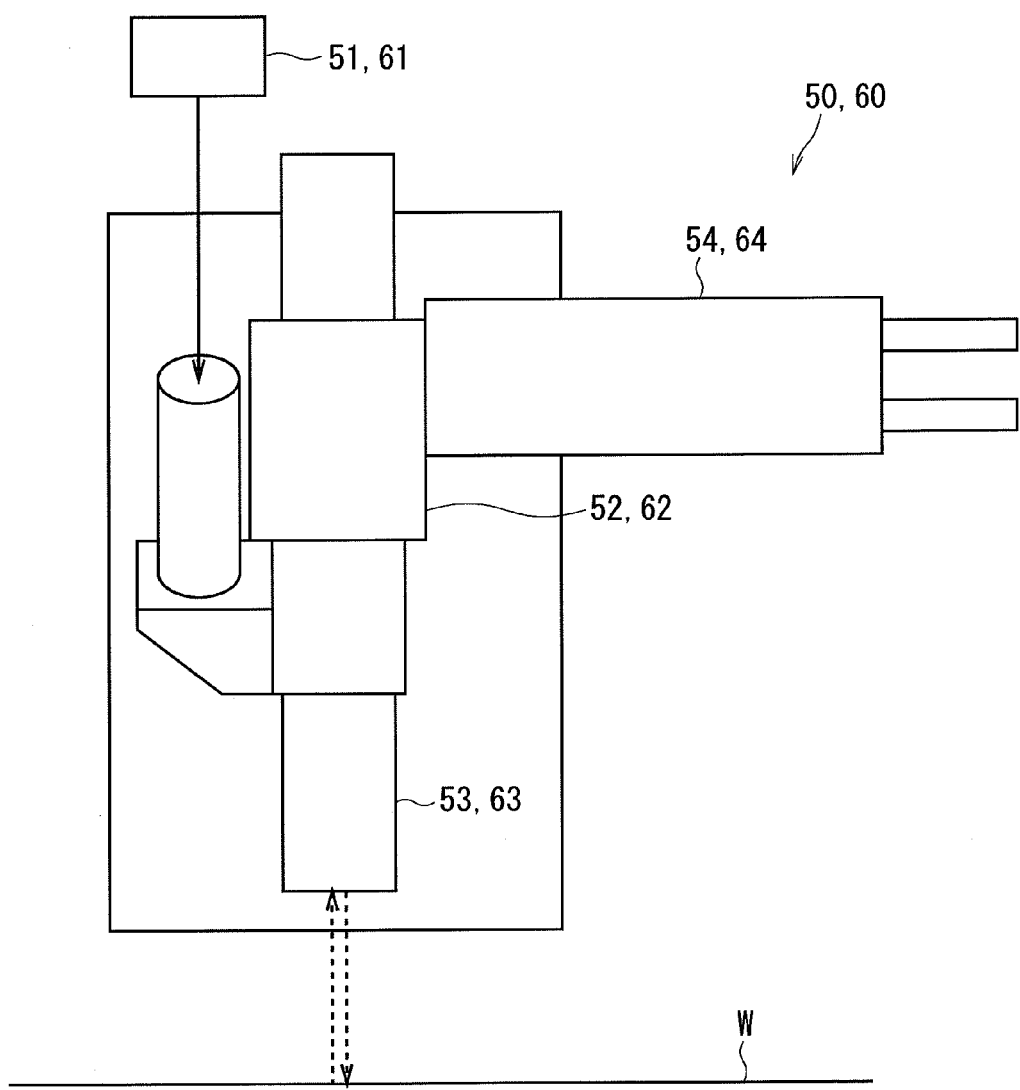
FIG. 3 is a view illustrating each configuration example of a preceding image capturing unit and an alignment unit.

A preceding image capturing unit 50 is associated with the optical head part 40, is arranged near the associated optical head part 40 (more specifically, a fixed distance toward the upstream side in a moving direction in which the optical head part 40 relatively moves with respect to the substrate W when main scan is performed), and captures images of an area (drawing scheduled area) on the substrate W of which the associated optical head part 40 is scheduled to capture images. The configuration of the preceding image capturing unit 50 will be described with reference to FIG. 3. FIG. 3 is a view illustrating a configuration example of the preceding image capturing unit 50.

The preceding image capturing unit 50 has a light source 51 which is formed with, for example, a LED; a lens barrel 52, an objective lens 53, and a CCD image sensor 54 which is formed with, for example, a linear image sensor (one-dimensional image sensor).

Light emitted from the light source 51 is led to the upper surface of the substrate W through the lens barrel 52, and its reflected light is received by the CCD image sensor 54 through the objective lens 53. By this means, captured image data of the upper surface of the substrate W is acquired. The CCD image sensor 54 is electrically connected with the controller 90, acquires captured image data according to the command from the controller 90 and transmits the acquired captured image data to the controller 90.

In addition, the preceding image capturing unit 50 may further has an auto-focus unit which is formed with a driver which adjusts the position of the objective lens 53 and a position detecting unit which detects the height position (position along the Z axis direction) of the upper surface of the substrate W. To command the auto-focus unit to automatically adjust the focus, the controller 90 commands the position detecting unit to detect the height position of the image capturing scheduled position in the upper surface of the substrate W, controls the driver based on acquired position information and adjusts the objective lens 53 such that the objective lens 53 is placed in an adequate position.

<Alignment Unit 60>

The alignment unit 60 captures images of alignment marks AL (see FIG. 10) formed on the upper surface of the substrate W. The alignment unit 60 employs substantially the same configuration as the preceding image capturing unit 50. That is, as illustrated in FIG. 3, the alignment unit 60 has an illuminating unit 61, a lens barrel 62, an objective lens 63, and a CCD image sensor 64. The CCD image sensor 64 included in the alignment unit 60 is formed with, for example, an area image sensor (two-dimensional image sensor).

The illuminating unit 61 is connected with the lens barrel 62 through the fiber 601, and supplies illumination light to the alignment unit 60. The configuration of the illuminating unit 61 will be described with reference to FIG. 4. FIG. 4 is a view illustrating a configuration example of the illuminating unit 61.

The illuminating unit 61 has a halogen lamp 611 which is connected with the fiber 601 through a rotation filter 612, the rotation filter 612 which is arranged on the optical path of light L which is emitted from the halogen lamp 611 and incident on the fiber 601, and a rotation motor 613 which rotates the rotation filter 612. The halogen lamp 611 and rotation motor 613 are electrically connected with the controller 90, and operate according to the command from the controller 90.

The rotation filter 612 has a plurality of windows respectively fitted with filters of different types and one window without a filter. Each window is arranged in a radial pattern around the rotation axis of the rotation filter 612. The various filters fitted in the windows each allow transmission of wavelengths of different bands. For example, filters which allow transmission of visible light are fitted in certain windows, and filters which allow transmission of infrared light are fitted in other windows.

The controller 90 rotates the rotation filter 612 by controlling the rotation motor 613 according to the wavelength of light which must be supplied to the alignment unit 60, and changes windows to be arranged on the optical path (optical path of light incident on the fiber 601 from the halogen lamp 611). For example, when infrared light must be supplied to the alignment unit 60, the controller 90 controls the rotation motor 613 to rotate the rotation filter 612 such that windows fitted with the filters which allow transmission of infrared light are arranged on the optical path. Then, only infrared light among light emitted from the halogen lamp 611 transmits through the filters, and only the infrared light is incident on the fiber 601.

FIG. 3 will be referred to again. Light led from the fiber 601 extending from the illuminating unit 61 is led to the upper surface of the substrate W through the lens barrel 62, and its reflected light is received by the CCD image sensor 64 through the objective lens 63. By this means, captured image data of the upper surface of the substrate W is acquired. The CCD image sensor 64 is electrically connected with the controller 90, acquires captured image data according to the command from the controller 90 and transmits the acquired captured image data to the controller 90.

In addition, similar to the preceding image capturing unit 50, the alignment unit 60 may further have an auto-focus unit.

<Controller 90>

FIG. 1 and FIG. 2 will be referred to again. The controller 90 controls the operation of each part included in the drawing device 100 while executing various arithmetic operation processings. The controller 90 is formed with a computer which has for example, a CPU which performs various arithmetic operation processings, a ROM which stores, for example, a boot program, a RAM which serves as a work area for an arithmetic operation processing, a storing part (for example, hard disk) which stores, for example, programs and various files, a display which provides various displays, an inputting part which is formed with, for example, a keyboard and a mouse, and a data communicating part which has a data communication function through, for example, a LAN. The computer operates according to the program installed in the computer and functions as the controller 90 of the drawing device 100. Each functioning part implemented in the controller 90 may be implemented when the computer executes a predetermined program, or may be implemented by dedicated hardware.

The storing part included in the controller 90 stores data (pattern data) in which a pattern that must be drawn on the substrate W is described. The pattern data is, for example, CAD data which is generated using CAD. The controller 90 acquires pattern data prior to a series of processings of the substrate W and stores the data in the storing part. In addition, the pattern data may be acquired by, for example, receiving the pattern data from an external terminal device connected through, for example, a network, or by reading the pattern data from the storage medium.

<2. Drawing Unit 401>

<2-1. Entire Configuration>

The configuration of the drawing unit 401 included in the optical head part 40 will be described with reference to FIGS. 5A and 5B. FIGS. 5A and 5B are views schematically illustrating a configuration example of a drawing unit 401. FIG. 5A illustrates a view of the drawing unit 401 seen from −X direction. FIG. 5B illustrates a view of the drawing unit 401 seen from +Y direction.

The drawing unit 401 has a spatial modulating unit 44 which spatially modulates light incident on the drawing unit 401 at a predetermined angle through a mirror 431 from the illumination optical system 43 (see FIG. 1), based on pattern data, an optical path corrector 45 which corrects the path of light by shifting the path of the spatially modulated light emitted from the spatial modulating unit 44, and a projection optical system 46 which forms an image on the surface of the substrate W by leading to this surface the light for which the route is corrected in the optical path corrector 45. Each of the parts 44, 45 and 46 included in the drawing unit 401 is electrically connected with the controller 90, and operates according to the command from the controller 90.

Further, the drawing unit 401 may further has an auto-focus unit which is formed with a driver which adjusts the position of a focusing lens (objective lens) 465 included in the projection optical system 46 and a position detecting unit which detects the height position of the upper surface of the substrate W. To command the auto-focus unit to automatically adjust the focus, the controller 90 commands the position detecting unit to detect the height position of the drawing scheduled position in the upper surface of the substrate W, controls the driver based on the acquired position information and adjusts the focusing lens 465 of the projection optical system 46 such that the focusing lens 465 is placed in an adequate position (position where an image of light radiated from the optical head part 40 is formed in a drawing scheduled position).

<2-2. Configuration of Each Part>

Each of the parts 44, 45 and 46 included in the drawing unit 401 will be described in detail.

<Spatial Modulating Unit 44>

The spatial modulating unit 44 has a spatial light modulating member 441 which spatially modulates incident light by electrical control. Meanwhile, spatially modulating light specifically means changing spatial distribution of light (for example, amplitude, phase and polarized light).

Light emitted from the laser oscillator 41 (see FIG. 1) and converted into a line beam in the illumination optical system 43 (see FIG. 1) is led to the spatial light modulating member 441 by the mirror 431, and is radiated on an effective area on the spatial light modulating member 441 for which a modulation operation is effective. Specifically, in the spatial light modulating member 441, as explained later, a plurality of spatial light modulators 4411 are arranged (see FIG. 6) along the sub scan direction (X axis direction), and light emitted from the illumination optical system 43 is led to the spatial light modulating member 441 such that a linear cross-sectional surface of light flux is along an array direction of spatial light modulators 4411 and incidents in a plurality of spatial light modulators 4411 arranged here. Meanwhile, the spatial light modulating member 441 is arranged such that the normal line of the reflecting surface of the spatial light modulating member 441 is inclined with respect to the optical axis of incident light. As described below, light incident on the spatial light modulating member 441 through the mirror 431 is spatially modulated in the spatial light modulating member 441 based on control of the controller 90, and the spatially modulated light is incident on the projection optical system 46.

The spatial light modulating member 441 is formed utilizing, for example, a spatial modulating unit of a diffraction grating type (for example, GLV (Grating Light Valve) (registered trademark of Silicone Light Machines (Calif., San Jose)). The spatial modulating unit of a diffraction grating type is a diffraction grating which can change the depth of the grating, and is manufactured using, for example, a semiconductor device manufacturing technique.

The configuration of the spatial light modulating member 441 will be specifically described with reference to FIG. 6. FIG. 6 is a view schematically illustrating a configuration example of the spatial light modulating member 441.

The spatial light modulating member 441 employs a configuration where, on the substrate 400, a plurality of movable ribbons 401 and a plurality of fixed ribbons 402 are alternately aligned making their longitudinal directions parallel to each other. In addition, the width of each of the ribbons 401 and 402 along the lateral direction may substantially the same or may be different a little taking contrast or reflectivity into account.

Here, the movable ribbon 401 and fixed ribbon 402 which are adjacent to each other are a "a pair of ribbons 403" and a ribbon pair set 404 formed with three or more pairs (four with the present preferred embodiment) of ribbons 403 which are adjacent to each other corresponds to one pixel (pixel unit) of a pattern to be drawn. That is, one ribbon pair set 404 forms the spatial light modulator 4411 corresponding to one pixel. That is, the spatial light modulating member 441 employs a configuration where a plurality of spatial light modulators 4411 are arranged in one dimension. In addition, the pixel size of drawing light which is further divided by the spatial light modulating member 441 described here, then individually modulated, and reduced and projected on an exposure surface through the projection optical system 46, is "about 2.5 μm (micrometers)". That is, the spatial modulating unit 44 can spatially modulate incident light in units of "about 2.5 μm (micrometers)" (drawing resolution).

The configuration of the spatial light modulator 4411 will be described in more detail with reference to FIG. 7 and FIG. 8. The surface of each of the ribbons 401 and 402 forms the reflecting surface of a belt shape. The fixed ribbons 402 are disposed on the substrate 400 through spacers (not illustrated), and are fixed in positions a certain distance spaced apart from the substrate 400. Therefore, at a posture parallel to the surface of the substrate 400 (hereinafter referred to as a "reference plane 400f"), the surfaces of the fixed ribbons 402 form fixed reflecting surfaces 402f fixed to the reference plane 400f.

Figure 7:
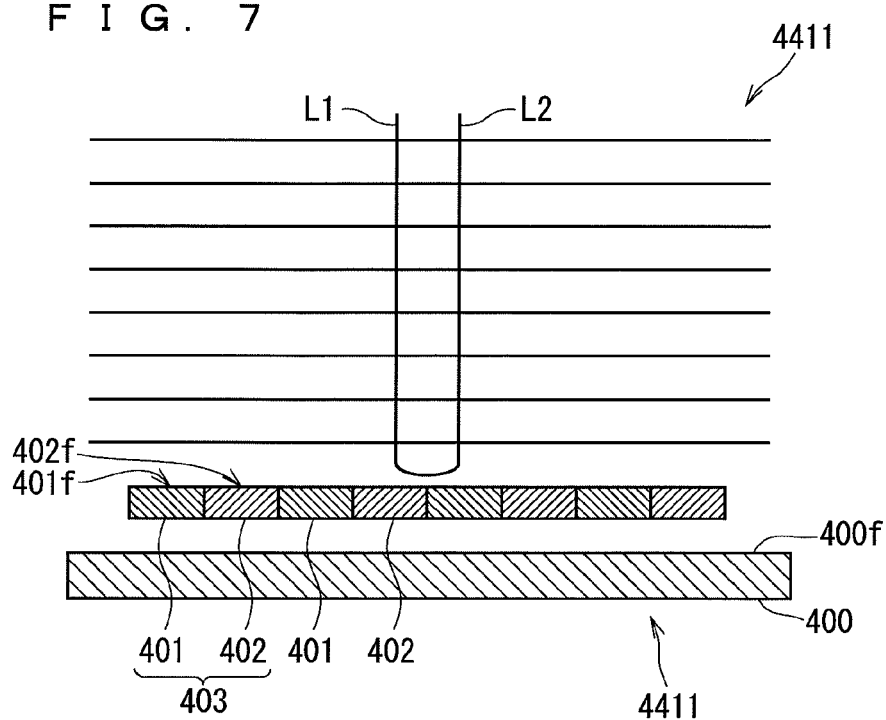
Figure 8:
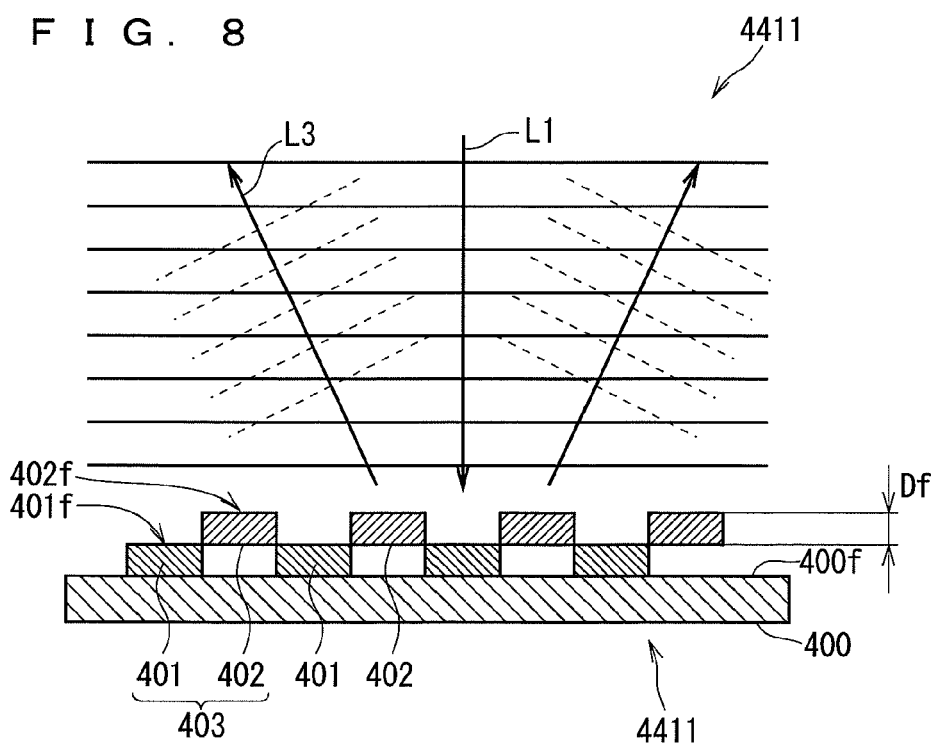
FIG. 8 is a view illustrating the spatial light modulator in a state where the voltage is turned off.

By contrast with this, the movable ribbons 401 are made movable between the same positions as the fixed ribbons 402 (that is, the positions a certain distance spaced apart from the substrate 400) (see FIG. 7) and the positions lowered toward the reference plane 400f (see FIG. 8). Consequently, the surfaces of the movable ribbons 401 form movable reflecting surfaces 401F which are movable with respect to the reference plane 400f while maintaining a posture parallel to the reference plane 400f.

The operation of the spatial light modulator 4411 is controlled by turning on and off the voltage to be applied between the movable ribbons 401 and substrate 400.

In a state where the voltage is turned off, the movable ribbons 401 are in positions where the distance to the reference plane 400f is the same as the fixed ribbons 402 and the movable reflecting surfaces 401f and fixed reflecting surfaces 402f are co-planar (the state illustrated in FIG. 7). That is, in a state where the voltage is turned off, the surface of the spatial light modulator 4411 is planar. When light is incident on the spatial light modulator 4411 in this state, this incident light L1 is regularly reflected without being diffracted. By this means, the regularly reflected light (zero-order light) L2 is produced.

By contrast with this, in a state where the voltage is turned on, the movable ribbons 401 are in positions where the movable ribbons 401 are lowered toward the reference plane 400f, the movable reflecting surfaces 401f are lowered toward the reference plane 400f compared to the fixed reflecting surfaces 402f (state illustrated in FIG. 8). That is, in a state where the voltage is turned on, a plurality of parallel grooves are formed at regular intervals on the surface of the spatial light modulator 4411. When light is incident on the spatial light modulator 4411 in this state, an optical path difference is produced between reflected light reflected by the movable reflecting surfaces 401f and reflected light reflected by the fixed reflecting surfaces 402f. Meanwhile, as described later, in the spatial light modulator 4411, this optical path difference (hereinafter, represented by "d") is configured to provide "d=(n+½)λ (where λ is the wavelength of incident light L1 and n takes any integer value)". Consequently, regularly reflected light (zero-order light) cancels each other and disappears, thereby producing other-order diffracted light (±first-order diffracted light and higher-order diffracted light) L3. To be more accurate, the intensity of the zero-order light is minimum and the intensity of the other-order diffracted light is maximum.

In addition, although a state is provided where the movable ribbons 401 and fixed ribbons 402 are placed in equal positions (positions an equal distance spaced apart from the reference plane 400f and positions where the zero-order light is produced) when the voltage is turned off, the positional relationship between the voltage and the position of each of the ribbons 401 and 402 is not necessarily limited to this, a configuration is possible where the movable ribbons 401 and fixed ribbons 402 are placed in equal positions (positions where the zero-order light is produced) upon any voltage and, further, are placed in positions where the first-order diffracted light is produced upon another voltage.

The optical path difference d is defined using a separated distance Df between the movable reflecting surfaces 401f and fixed reflecting surfaces 402f in a state where the voltage is turned on, wavelength λ of incident light L1, and incident angle α of the incident light L1 (Equation 1). Meanwhile, the "incident angle α of the incident light L1" refers to an angle formed between the optical axis of the incident light L1 and the normal direction of the reflecting surfaces 401f and 402f.

$$d = 2Df \cos \alpha \quad \text{(Equation 1)}$$

That is, in the spatial light modulator 4411, the separated distance Df, and the incident angle α of the incident light L1 are adjusted to values satisfying the relationship of (Equation 2).

$$(n+½)\lambda = 2Df \cos \alpha \quad \text{(Equation 2)}$$

For example, when "d=(7/2)λ" is required for the optical path difference d, the separated distance Df is "(7/4)λ/cos α".

Meanwhile the optical axis of the incident light L1 incident on the spatial light modulator 4411 is inclined at an angle α with respect to the normal direction of the reflecting surfaces 401f and 402f, and the direction to align the ribbons 401 and 402 (direction orthogonal to the longitudinal direction of each of the ribbons 401 and 402) is vertical. Here, the incident light L1 is slightly concentrated in a direction vertical to the optical axis and the direction to align the ribbons 401 and 402, and is parallel to the alignment direction. That is, the incident light L1 is linear light having a long light flux cross-sectional surface in the alignment direction.

FIG. 6 will be referred to again. The spatial light modulating member 441 has a driver circuit unit 4412 which can individually apply voltages to a plurality of spatial light modulators 4411 included in the spatial light modulating member 441, respectively.

The state of the surface of each spatial light modulator 4411 is switched between a state (off state) (state illustrated in FIG. 7) where the zero-order light L2 is emitted and a state (on state) (state illustrated in FIG. 8) where the first-order and higher-order diffracted light L3 (±first-order diffracted light, ±second-order diffracted light, ±third-order diffracted light and . . . ) are emitted according to the voltage (hereinafter referred to as an "input voltage") applied to the spatial light modulating member 441 from the driver circuit unit 4412.

Light emitted from each spatial light modulator 4411 (the zero-order light L2 or first-order diffracted light L3) is led to the projection optical system 46 through the optical path corrector 45. As described below, the projection optical system 46 blocks the first-order diffracted light L3 and allows transmission of only the zero-order light L2. That is, only the zero-order light L2 reaches the surface of the substrate W.

The driver circuit unit 4412 is connected with the controller 90, and applies the voltage to the specified spatial light modulator 4411 according to the command from the controller 90. That is, the controller 90 gives a command to the driver circuit unit 4412 based on pattern data and the driver circuit unit 4412 applies the voltage to the specified spatial light modulator 4411, so that it is possible to spatially modulate incident light according to the pattern data.

In addition, in the optical head part 40, the spatial light modulating member 441 is arranged such that the direction to align the spatial light modulator 4411 included in the spatial light modulating member 441 is along the sub scan direction (X axis direction). Hence, when the number of spatial light modulators 4411 included in the spatial light modulating member 441 is "N", spatially modulated light of N pixels along the sub scan direction is emitted from the spatial light modulating member 441.

As described later, the optical head part 40 relatively moves with respect to the substrate W along the main scan direction (Y axis direction) while intermittently radiating spatially modulated light of the N pixels along the sub scan direction (that is, continuing repeatedly projecting pulse light on the surface of the substrate W). Consequently, when the optical head part 40 crosses the substrate W once along the main scan direction, one pattern group having the width corresponding to the N pixels is drawn along the sub scan direction on the surface of the substrate W. This one pattern drawing area having the width corresponding to the N pixels will also be referred to as the "area of one stripe" in the following description.

<Optical Path Corrector 45>

Figure 9:
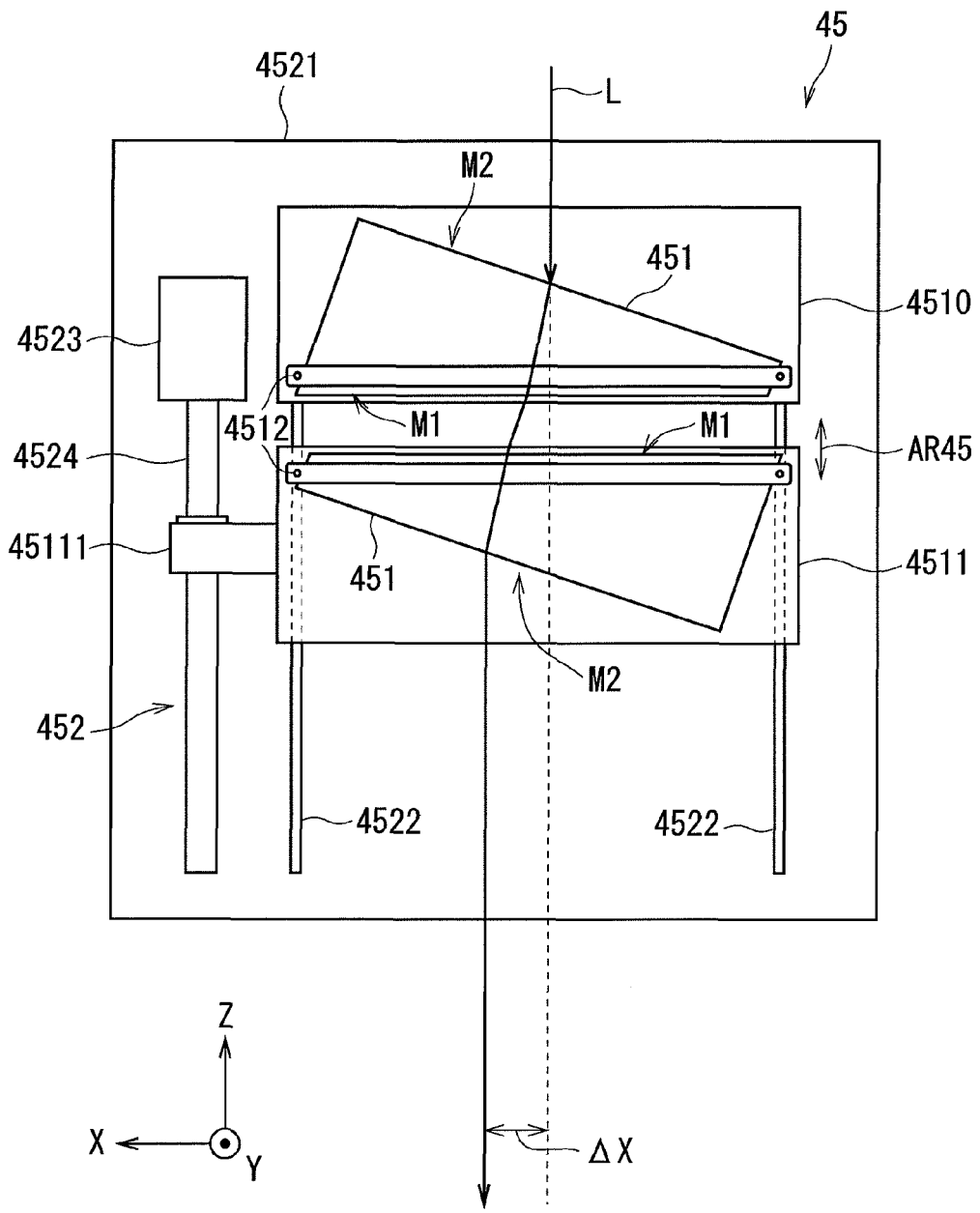
FIG. 9 is a view schematically illustrating a configuration of an optical path corrector.

The optical path corrector 45 will be described with reference to FIG. 9. FIG. 9 is a view schematically illustrating a configuration of the optical path corrector 45.

The optical path corrector 45 shifts the path of light emitted from the spatial modulating unit 44 (that is, light spatially modulated according to pattern data), along the sub scan direction. More specifically, the optical path corrector 45 has at least one optical component, and shifts the optical path of incident light at precision subdivided more than units of spatial modulation in the spatial modulating unit 44 (more specifically, units of pixels of the spatial light modulating member 441 reduced and projected on the exposure surface through the projection optical system 46) by changing the position (or posture) of at least one optical component.

The optical path corrector 45 can be realized with, for example, two wedge prisms 451 and a wedge prism moving mechanism 452 which moves one wedge prism 451 linearly along the direction (Z axis direction) of the optical axis L of incident light with respect to the other wedge prism 451.

The wedge prism 451 is a prism which has unparallel optical surfaces M1 and M2 and, consequently, can change the optical path of incident light. The two wedge prisms 451 have the substantially same structure (for example, structure in which the apex angles and refractive indices become the same).

The two wedge prisms 451 are fixed to a fixed stage 4510 and a movable stage 4511, and are arranged along the direction (Z axis direction) of the optical axis L of incident light such that the opposing optical surfaces M1 are parallel to each other and are oriented to the opposite directions from each other. Each wedge prism 451 is fixed to each of the stages 4510 and 4511 using, for example, fixing bands 4512.

The fixed stage 4510 on which one wedge prism 451 is arranged is fixed on the base part 4521.

The movable stage 4511 on which the other wedge prism 451 is arranged is movable along a pair of guide rails 4522 formed on the base part 4521. The guide rails 4522 are formed extending along the Z axis direction on the base part 4521.

On the base part 4521, a ball screw 4524 which is rotated by a rotating motor 4523 is disposed. The ball screw 4524 extends along the extension direction of the guide rails 4522, and is screwed to a female screw part of a bracket 45111 of the movable stage 4511. With this configuration, when the rotating motor 4523 rotates the ball screw 4524, the movable stage 4511 moves in the Z direction along the guide rails 4522. That is, the wedge prism 451 fixed to the movable stage 4511 moves in the Z direction (arrow AR45).

That is, the movable stage 4511, guide rails 4522, rotating motor 4523 and ball screw 4524 form the wedge prism moving mechanism 452 which linearly moves one wedge prism 451 (wedge prism 451 fixed to the movable stage 4511) along the direction (Z axis direction) of the optical axis L of incident light. The wedge prism moving mechanism 452 linearly moves one wedge prism 451 along the optical axis direction (Z axis direction) with respect to the other wedge prism 451 (wedge prism 451 fixed to the fixed stage 4510) to change the separated distance between the two wedge prisms 451 along the optical axis direction.

The optical path corrector 45 employing the above configuration can shift the path of light incident on the wedge prisms 451 along the X axis direction by changing the separated distance between the two wedge prisms 451 along the optical axis. Meanwhile, this amount of shift Δx is determined according to the separated distance between the respective wedge prisms 451.

By controlling the wedge prism moving mechanism 452 and adjusting the separated distance between the two wedge prisms 451 along the Z axis direction, the controller 90 shifts the path of light emitted from the spatial modulating unit 44 along the X axis direction and corrects the drawing position along the sub scan direction (X axis direction).

In addition, the above-described optical path corrector 45 can shift the route at precision equal to or less than "0.5 μm (micrometers)", preferably, at precision of "about 0.5 μm (micrometers)". That is, by controlling the wedge prism moving mechanism 452, the controller 90 can correct the drawing position along the sub scan direction (X axis direction) at precision of "about 0.5 μm (micrometers)".

<Projection Optical System 46>

Next, the projection optical system 46 will be described with reference to FIG. 5 again. The projection optical system 46 is a functioning part which leads light which is spatially modulated in the spatial modulating unit 44 and for which the path is corrected in the optical path corrector 45, to the surface of the substrate W, and forms an image of the light on the surface of the substrate W, and in which, for example, a light blocking plate 461 which blocks ghost light and high-order diffracted light, two lenses 462 and 463 which form a zooming part, a diaphragm plate 464 which blocks high-order diffracted light and a focusing lens 465 which forms a focusing part are arranged sequentially from the spatial modulating unit 44 side.

Light having passed the lenses 462 and 463 is led to the diaphragm plate 464 having an aperture. Here, part of light (zero-order light L2 (see FIG. 7)) passes the aperture of the diaphragm plate 464 and is led to the focusing lens 465, and the rest of light (±first-order diffracted light L3 (see FIG. 8)) is blocked by the diaphragm plate 464. The light (zero-order light L2) having passed the focusing lens 465 is led to the surface of the substrate W at a predetermined magnification.

In addition, the projection optical system 46 does not necessarily need to be formed with the light blocking plate 461, lenses 462 and 463, diaphragm plate 464 and focusing lens 465, and, for example, may be added other optical elements.

<3. Flow of Processing>

<3-1. Entire Flow>

A flow of a series of processings executed in the drawing device 100 will be described. In addition, as illustrated in FIG. 10, on the substrate W to be processed in the drawing device 100, scribe lines 121 of a grid pattern are formed and a plurality of exposure areas 122 surrounded by the scribe lines 121 are defined. Further, on the scribe lines 121, a plurality of alignment marks AL are formed. The alignment mark is, for example, a cross mark where a mark portion used for positioning the substrate W in the front-back direction (long mark portion along the front-back direction of the substrate W) and a mark portion used for positioning the substrate W in the left-right direction (long mark portion along the left-right direction of the substrate W) are overlapped, and is formed with, for example, a multilayer film reflecting layer (multilayer film reflecting layer which is formed by, for example, a depositing method and which efficiently reflects infrared light) of about 0.1 mm (millimeter) side. In addition, although two alignment marks AL are illustrated in the figure, more alignment marks AL may be formed on the substrate W. Further, instead of individual marks, a mark of a continuous pattern may be formed.

The flow of a series of processings executed in the drawing device 100 will be described with reference to FIG. 11. FIG. 11 is a view illustrating the flow of a series of processings.

When the transporting device 70 carries in and sets on the stage 10 the substrate W to be processed, a series of processings with respect to this substrate W is started (step S1).

First, images of the alignment marks AL are captured (step S2). More specifically, the stage moving mechanism 20 relatively moves the substrate W with respect to the alignment unit 60 by moving the stage 10 according to the command from the controller 90, and moves the substrate W such that the predetermined position of the substrate W (positions to form the alignment marks AL) is placed below the alignment unit 60. When the substrate W is moved to a target position, the alignment unit 60 captures an image of the surface of the substrate W according to the command from the controller 90. By this means, captured image data of the alignment marks AL is obtained. This operation is repeated a predetermined number of times, so that each captured image data of the alignment marks AL respectively formed in different positions on the substrate W is obtained.

Then, the position of the stage 10 is adjusted (step S3). In this processing, the controller 90 first specifies the position and orientation of the substrate W with respect to the stage 10, based on a plurality of items of captured image data obtained in step S2. When the position and orientation of the substrate W with respect to the stage 10 is specified, the controller 90 adjusts the position of the stage 10 by controlling the stage position measurer 30 and stage moving mechanism 20. More specifically, the controller 90 adjusts the position of the stage 10 such that the substrate W set on the stage 10 is placed in a fixed position and orientation with respect to the optical head part 40.

In addition, processing in step S3 may be performed by correcting pattern data such that the position of the substrate W with respect to the optical head part 40 is adjusted. That is, the processing in step S3 may be performed by performing correction processing of pattern data instead of adjusting the position of the stage 10.

Next, correction processing of pattern data is performed (step S4). In this processing, the controller 90 first detects the positions of the alignment marks AL from a plurality of items of captured image data obtained in step S2. Then, the offset range from the ideal detection positions (positions of the alignment marks AL which must be detected when the substrate W is not deformed) is detected as the amount of offset. When the substrate W is deformed (the change of the shape due to, for example, distortion, shrinkage or expansion), this is detected as the amount of offset. When the substrate W is deformed, the position of an underlying pattern formed on the deformed substrate W is predicted to be in the position offset by the detected amount of offset. Hence, the controller 90 corrects pattern data such that the pattern data matches the predicted position to form the underlying pattern. That is, by correcting the pattern to be described in the pattern data such that the pattern is offset by the detected amount of offset, the pattern to be described in the pattern data is deformed similar to the substrate W. The obtained pattern data after correction will be referred to as "corrected pattern data" below. In addition, this processing may be performed in parallel to the processing of step S3.

When the processings in step S3 and step S4 are finished, pattern drawing processing with respect to the substrate W is performed based on the corrected pattern data obtained in step S4 (step S5). This processing will be described in more details below.

When pattern drawing processing with respect to the substrate W is finished, the transporting device 70 carries the processed substrate W out and a series of processings with respect to the substrate W are finished (step S6).

<3-2. Drawing Processing>

Figure 12:
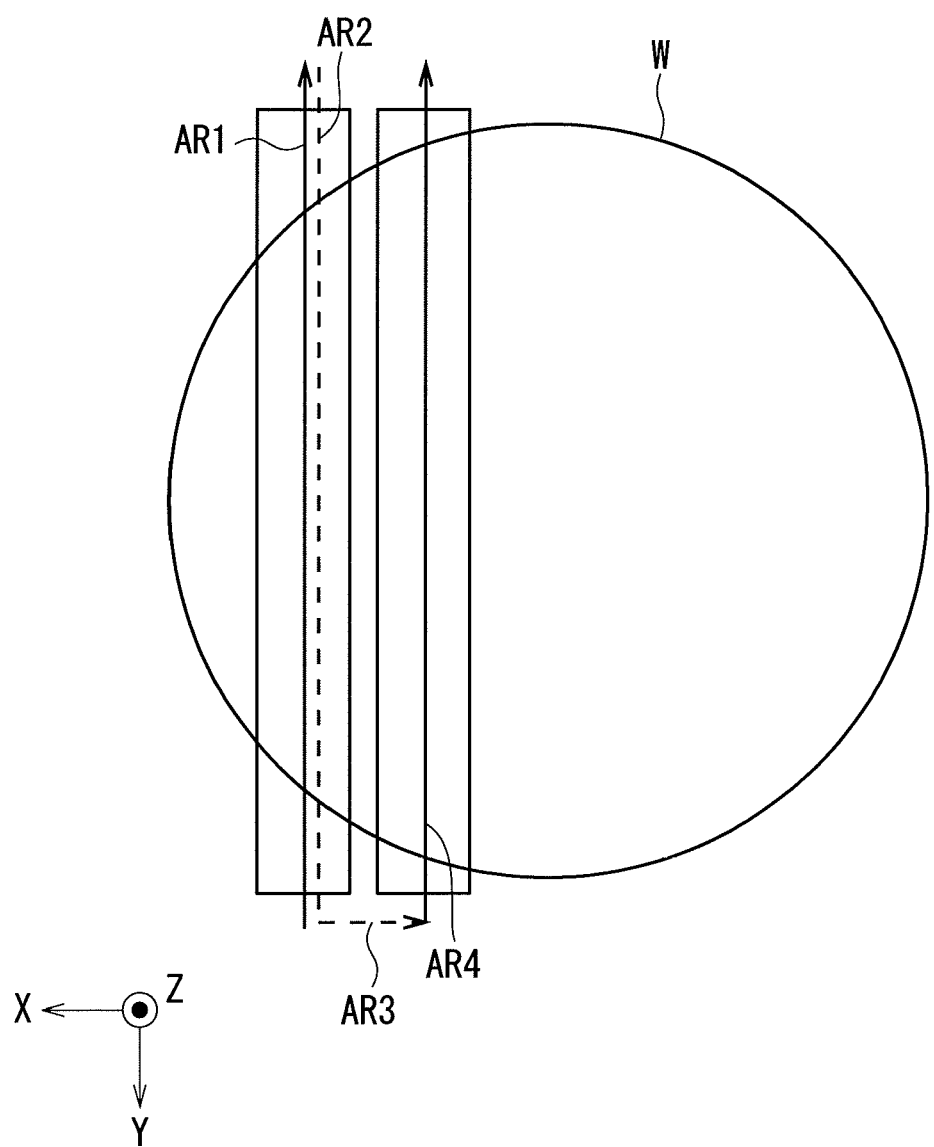
FIG. 12 is a view schematically illustrating the state of an optical head part and the substrate during pattern drawing processing.

Pattern drawing processing (processing in step S5 of FIG. 11) executed in the drawing device 100 will be described with reference to FIG. 12. FIG. 12 is a view schematically illustrating the state of the optical head part 40 and substrate W during pattern drawing processing.

<3-2-1. Entire Flow>

To perform the pattern drawing processing with respect to the substrate W, the controller 90 controls the stage moving mechanism 20 and relatively moves the substrate W set on the stage 10 with respect to the optical head part 40, and the optical head part 40 radiates spatially modulated light on the upper surface of the substrate W.

More specifically, the stage moving mechanism 20 moves the stage 10 along the main scan direction (+Y axis direction) according to the command from the controller 90, and relatively moves the substrate W with respect to the optical head part 40 along the main scan direction (arrow AR1) (main scan). While the substrate W is relatively moved along the main scan direction, the optical head part 40 radiates spatially modulated light matching corrected pattern data (more specifically, rasterized corrected pattern data), on the substrate W according to the command from the controller 90.

When the end part of the substrate W on the +Y side passes below the optical head part 40, one main scan is finished. When one main scan is finished, one stripe is drawn on the surface of the substrate W.

When main scan is finished, the stage moving mechanism 20 moves the stage 10 in the opposite direction (−Y axis direction) along the main scan direction, and moves the substrate W to the original position (main scan start position) (arrow AR2). Further, the stage moving mechanism 20 moves the stage 10 by the distance corresponding to the width of one stripe, along the sub scan direction (X axis direction) and thereby relatively moves the substrate W with respect to the optical head part 40 along the sub scan direction (arrow AR3) (sub scan).

When sub scan is finished, main scan is performed again (arrow AR4). Here, the optical head part 40 radiates spatially modulated light matching corrected pattern data, on the substrate W according to the command from the controller 90. By this means, one stripe is further drawn in an area of one stripe adjacent to the drawing area of one stripe drawn in the previous main scan. In this way, main scan and sub scan are repeated, so that the pattern is drawn on the entire area of the surface of the substrate W.

<3-2-2. Drawing of Each Stripe>

Figure 13:
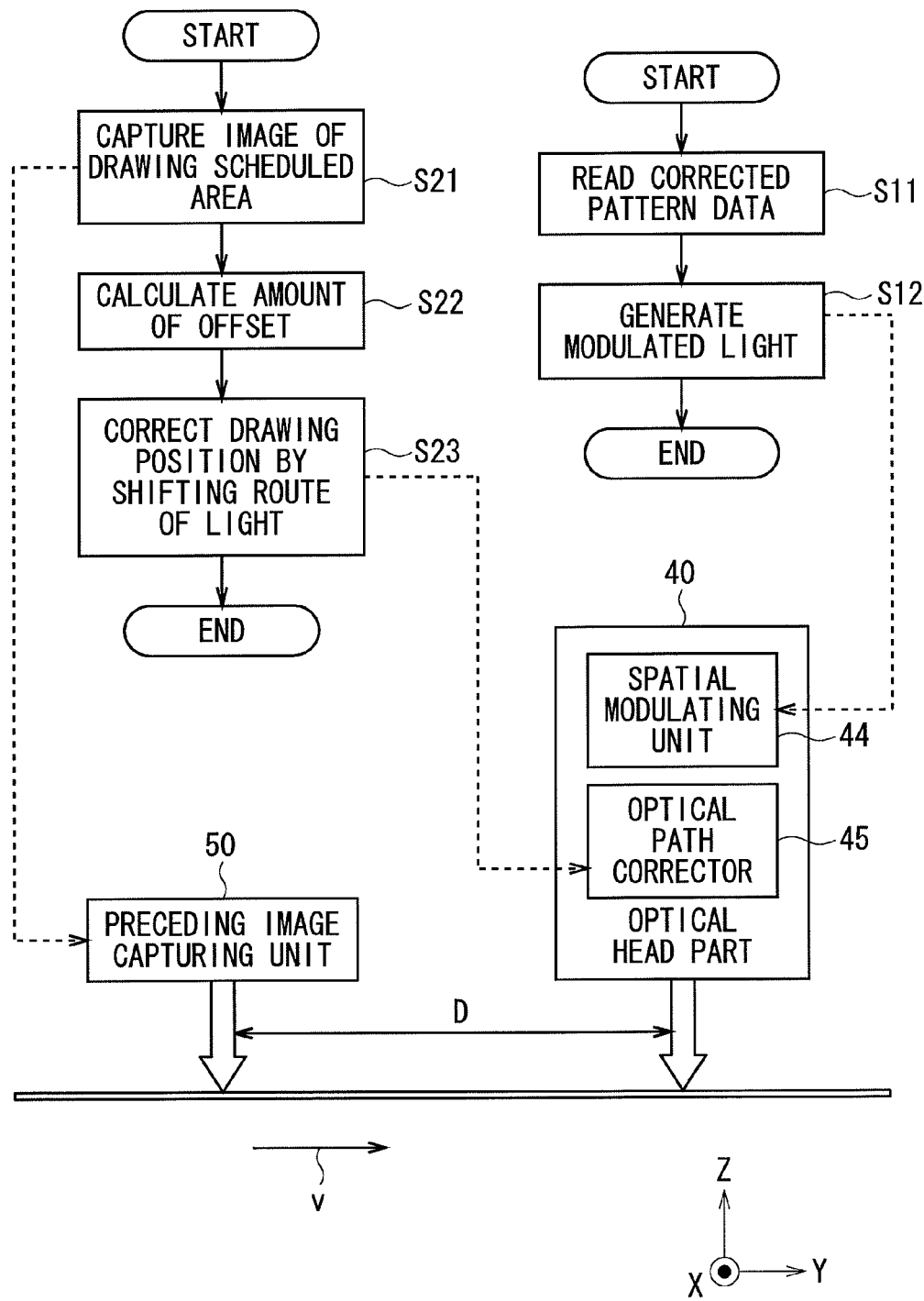
FIG. 13 is a diagram for illustrating an operation of pattern drawing processing.

As descried above, in drawing processing, a pattern is drawn on the entire substrate W by repeatedly drawing one stripe in the area of one stripe. Here, the flow of processing of drawing one stripe in an area of one stripe will be described with reference to FIG. 13. FIG. 13 is a view illustrating the flow of this operation.

When scan is started along the main scan direction, the controller 90 reads the corrected pattern data stored in the storing part (more specifically, a portion in which data among the corrected pattern data that must be drawn in an area of one stripe to be drawn is described), and rasterizes the corrected pattern data (step S11).

Further, the controller 90 commands the optical head part 40 to generate modulated light matching the corrected pattern data read in step S11 (step S12). More specifically, the controller 90 controls the laser driver 42 of the optical head part 40 to command the laser oscillator 41 to emit laser light and command the spatial modulating unit 44 to receive incident light, and controls the driver circuit unit 4412 based on the corrected pattern data to spatially modulate the incident light according to the pattern described in the corrected pattern data.

By contrast with this, when scan is started along the main scan direction, the controller 90 commands the preceding image capturing unit 50 to acquire captured image data of a drawing scheduled area on the surface of the substrate W (step S21). Meanwhile, the preceding image capturing unit 50 is arranged a fixed distance D toward an upstream side from the optical head part 40. Consequently, the preceding image capturing unit 50 acquires captured image data of the area (drawing scheduled area) on the substrate W on which the optical head part 40 is scheduled to draw a pattern after a certain time (more specifically, after the substrate W moves a distance D with respect to the optical head part 40).

The controller 90 analyzes the captured image data acquired by the preceding image capturing unit 50, and detects the position of the underlying pattern formed in the drawing scheduled area. Then, the detected position is stored as a target position. Further, the controller 90 calculates how the drawing scheduled position for modulated light generated in step S12 is offset from the target position in the sub scan direction, and acquires the calculated value as the amount of offset (step S22). That is, the offset range between the drawing scheduled position and underlying pattern along the sub scan direction is detected as the amount of offset. For example, when, for example, a minute wrinkle is formed in the underlying pattern, this is detected as the amount of offset.

When the modulated light generated in step S12 is incident on the optical path corrector 45, the controller 90 controls the wedge prism moving mechanism 452, shifts the path of the incident light by the amount of offset acquired in step S22 along the sub scan direction (X axis direction), and corrects the drawing position (step S23). An image of the light for which the optical path is shifted by the amount of offset from the drawing scheduled position is formed in the target position (that is, the position of the underlying pattern). That is, the drawing position is corrected, so that the pattern which is precisely overlaid on the underlying pattern is drawn.

Meanwhile, drawing processing with respect to the drawing scheduled area for which an image is captured at a certain time t is executed at a time when "D/v (where "D" is a separated distance between the preceding image capturing unit 50 and optical head part 40 along the main scan direction and "v" is a relative moving velocity of the substrate W with respect to the optical head part 40, along the main scan direction)" passes from the time t. Consequently, the controller 90 reflects the amount of offset calculated based on captured image data obtained at a certain time t, in drawing processing executed at time after the time Δt=D/v passes from the time t.

<4. Function Block>

Hereinafter, each function realized in the drawing device 100 will be summarized with reference to FIG. 14. FIG. 14 is a block diagram representing each function realized in the drawing device 100.

As is obvious from the above description, the spatial modulating unit 44 spatially modulates light which is incident on the spatial modulating unit 44 from the light source (laser oscillator 41) through the illumination optical system 43, based on pattern data according to the command from the controller 90. That is, the controller 90 and spatial modulating unit 44 collaborate to realize the functioning part (spatial light modulation processor 901) which generates modulated light according to pattern data.

Further, the optical path corrector 45 corrects the drawing position by shifting the path of light spatially modulated in the spatial modulating unit 44 at precision subdivided more than units of spatial modulation in the spatial modulating unit 44, according to the command from the controller 90. That is, the controller 90 and optical path corrector 45 collaborate to realize the functioning part (optical path correction processor 902) which shifts the path of spatially modulated light.

Further, the controller 90 realizes the function of a data corrector 903 which corrects pattern data based on the position to form the underlying pattern previously formed on the substrate W (more specifically, position to form the underlying pattern, which is predicted based on captured image data of the alignment marks AL acquired by the alignment unit 60), and the spatial light modulation processor 901 generates modulated light based on the pattern data after correction (corrected pattern data).

Further, the controller 90 realizes the function of the shift amount calculator 904 which detects the position to form the underlying pattern previously formed on the substrate W (more specifically, detects the position to form the underlying pattern by analyzing captured image data acquired by the preceding image capturing unit 50), and calculates the amount of shift for shifting the route of spatially modulated light, based on this detected position, and the optical path correction processor 902 corrects the drawing position by shifting the route of the spatially modulated light by the calculated amount of shift.

<5. Effect>

When the drawing position is corrected by correcting pattern data, the drawing position can only be corrected at precision in units of spatial modulation (more specifically, the width of pixels of the spatial light modulator 4411) in the spatial modulating unit 44. Therefore, even if, for example, pattern data is corrected to precisely match the underlying pattern, it is difficult to cancel the offset between the target position and drawing position at the level subdivided more than the width of the pixels of the spatial light modulator 4411.

With the drawing device 100 according to the above preferred embodiment, the optical path corrector 45 corrects the drawing position by shifting the path of light spatially modulated in the spatial modulating unit 44, at precision subdivided more than units of the spatial modulation in the spatial modulating unit 44, so that it is possible to align the drawing position and target position at a level which cannot be realized by correcting pattern data. That is, it is possible to precisely control the drawing position of a pattern with respect to the substrate W.

Further, the drawing device 100 according to the above preferred embodiment first corrects pattern data based on the position to form an underlying pattern, and the spatial modulating unit 44 spatially modulates light based on the pattern data after correction (corrected pattern data). Then, the optical path corrector 45 makes fine adjustment of the drawing position by further correcting the path of the spatially modulated light. That is, correction in units of spatial modulation and correction at precision subdivided more than the units of spatial modulation are performed at two stages. With this configuration, it is possible to precisely control the drawing position with respect to the underlying pattern. For example, it is possible to draw a pattern which is precisely overlaid on the underlying pattern.

Further, with the drawing device 100 according to the above preferred embodiment, the preceding image capturing unit 50 acquires captured image data of a drawing scheduled area, and the controller 90 detects the position to form the underlying pattern based on the captured image data and calculates the amount of shift for shifting the route of spatially modulated light based on this detection position. Consequently, it is possible to accurately control the drawing position with respect to the underlying pattern.

Further, with the drawing device 100 according to the above preferred embodiment, the preceding image capturing unit 50 which captures an image of the drawing scheduled area of the substrate W is provided on the front side of the optical head part 40 (front side in a moving direction in which the optical head relatively moves with respect to the target object), so that it is possible to reliably and effectively measure the position to form the underlying pattern which is previously formed in the area in the target object for which the optical head part 40 draws a pattern.

<6. Other Preferred Embodiment>

With the above preferred embodiment, although the optical path corrector 45 employs a configuration including the two wedge prisms 451 and wedge prism moving mechanism 452, the optical path corrector 45 does not necessarily need to employ this configuration. The optical path corrector 45 may be formed with, for example, a glass plate and a posture changing mechanism which rotatably supports the glass plate with respect to the rotation axis along the Y axis direction (that is, direction orthogonal to the optical axis direction (Z axis direction) and sub scan direction (X axis direction)). With this configuration, by changing the posture of the glass plate and changing the incident angle of light which is incident on the glass plate, it is possible to shift the route of light which is incident on the glass plate, along the X axis direction. Meanwhile, this amount of shift is determined according to the rotation angle of the glass plate.

In this case, by controlling the posture changing mechanism and adjusting the rotation angle of the glass plate, the controller 90 shifts light emitted from the spatial modulating unit 44 along the X axis direction and corrects the drawing position along the sub scan direction (X axis direction).

Further, with the above preferred embodiment, although the amount of offset which is a control parameter for driving the optical path corrector 45 is acquired by the preceding image capturing unit 50, the configuration of acquiring the amount of offset is not limited to this and any configuration is possible as long as the configuration of detecting the position of an underlying pattern is provided.

Further, with the above preferred embodiment, although a spatial modulator of a diffraction grating type is used as the spatial light modulating member 441, the configuration of the spatial light modulating member 441 is not limited to this. For example, a DMD (Digital Micromirror Device) may be utilized.

Further, with the above preferred embodiment, although the substrate W to be processed is a semiconductor substrate, other various substrates (for example, printed substrate, a color filter substrate equipped in a liquid crystal display device, or a flat panel display (FPD) glass substrate of a liquid crystal display device or a plasma display device) may be processed.

While the invention has been shown and described in detail, the foregoing description is in all aspects illustrative and not restrictive. It is therefore understood that numerous modifications and variations can be devised without departing from the scope of the invention.

What is claimed is:

1. A drawing device including an optical head and a drawing apparatus, which draws a pattern on a target object by repeatedly drawing one stripe on said target object by radiating light from said optical head on said target object while relatively moving said optical head and said target object along a main scan direction and repeatedly relatively moving said optical head and said target object along a sub scan direction orthogonal to said main scan direction, wherein
said optical head comprises:
a spatial light modulating part which spatially modulates light from a light source based on pattern data in which a pattern to be drawn on said target object is described; and
an optical path corrector which corrects a drawing position by shifting a path of light spatially modulated in said spatial light modulating part at a precision subdivided more finely than resolution units of said spatial modulation in said spatial light modulating part, and
said drawing apparatus comprises:
an image capturer which is provided a specified distance toward an upstream Side along said main scan direction from said optical head and which captures said image of drawing scheduled area on said target object; and
a shift amount calculator which detects said position of an existing pattern previously formed on said target object, from captured image data obtained by said image capturer capturing an image of said drawing scheduled area, and calculates an amount of shift for shifting said path of light spatially modulated based on said defected position, wherein
said image capturer captures said image of said drawing scheduled area on an upstream side in said main scan direction, said shift amount calculator calculates said shift amount based on the result of the image capturing, and thereafter, said optical head irradiates light on the said target object in a path of light shifted by the amount of said shift amount in a downstream side of said main scan direction, in each of said operation of performing drawing said one stripe on said target object.

2. The drawing device according to claim 1, further comprising a data corrector which corrects said pattern data based on a position of an existing pattern previously formed on said target object, wherein said spatial light modulating part spatially modulates light from said light source based on said corrected pattern data.

3. The drawing device according to claim 2, wherein said data corrector predicts the position of the existing pattern previously formed on said target object based on captured image data obtained by capturing an image of a representative position of said target object, and corrects said pattern data based on said predicted position of said existing pattern previously formed on said target object.

4. The drawing device according to claim 1, wherein said spatial light modulating part comprises a plurality of light modulators which are aligned in a certain direction, and spatially modulates light from said light source in units of pixels of each of said plurality of light modulators.

5. The drawing device according to claim 4, wherein said light modulator is a light modulator of a diffraction grating type.

6. The drawing device according to claim 1, wherein said optical path corrector comprises: an optical system in which two prisms including optical surfaces which are not parallel, are arranged on said path of spatially modulated light; and a prism mover which changes a separated distance between said two prisms to shift said path of spatially modulated light.

7. A drawing method of drawing a pattern on a target object by repeatedly drawing one stripe on said target object by radiating light from an optical head on said target object while relatively moving said optical head and said target object along a main scan direction and repeatedly relatively moving said optical head and the said target object along a sub scan direction orthogonal to said main scan direction, each said drawing said one stripe, comprising the steps of:
a) capturing an image of a drawing scheduled area on said target object at a specified distance toward an upstream side along said main scan direction from said optical head;
b) detecting said position of an existing pattern previously formed on said target object, from captured image data obtained by said image capturer capturing an image of said drawing scheduled area, and calculating an amount of shift for shifting a path of light spatially modulated based on said detected position;
c) spatially modulating light from a light source based on a pattern data in which a pattern to be drawn on said target object is described; and
d) correcting a drawing position by shifting a path of spatially modulated light at a precision subdivided more finely than resolution units of said spatial modulation according to said shift amount; and
e) irradiating light on said target object by said optical head in a path of light shifted by the amount of said shift amount in a downstream side of said main scan direction.

* * * * *